United States Patent [19]

Kwon

[11] Patent Number: 5,917,357
[45] Date of Patent: Jun. 29, 1999

[54] DELAY CIRCUIT PROVIDING CONSTANT DELAY REGARDLESS OF VARIATIONS IN POWER SUPPLY

[75] Inventor: Gyu Wan Kwon, Kyungki-Do, Rep. of Korea

[73] Assignee: Hyundai Electronics Industries Co., Ltd., Ichon-Shi, Rep. of Korea

[21] Appl. No.: 08/773,603

[22] Filed: Dec. 27, 1996

[30] Foreign Application Priority Data

Dec. 29, 1995 [KR] Rep. of Korea ...................... 95-65658

[51] Int. Cl.$^6$ ....................................................... H03K 5/13
[52] U.S. Cl. ........................... 327/262; 327/284; 327/285; 327/288
[58] Field of Search ................................... 327/261, 262, 327/362, 284, 285, 288, 276–278, 281, 198, 143; 365/226

[56] References Cited

U.S. PATENT DOCUMENTS

| | | | |
|---|---|---|---|
| 4,947,064 | 8/1990 | Kim et al. ............................... | 327/262 |
| 5,051,630 | 9/1991 | Kogan et al. ........................... | 327/262 |
| 5,068,553 | 11/1991 | Love ....................................... | 327/262 |
| 5,164,621 | 11/1992 | Miyamoto ............................... | 327/262 |
| 5,352,945 | 10/1994 | Casper et al. .......................... | 327/262 |
| 5,359,301 | 10/1994 | Candage .................................. | 327/262 |
| 5,557,579 | 9/1996 | Raad et al. . | |
| 5,617,049 | 4/1997 | Hirano et al. ............................ | 327/262 |
| 5,731,727 | 3/1998 | Iwamoto et al. ........................ | 327/262 |

FOREIGN PATENT DOCUMENTS 5-136664   6/1993   Japan ..................................... 327/261

Primary Examiner—Timothy P. Callahan
Assistant Examiner—Eunja Shin
Attorney, Agent, or Firm—Cohen, Pontani, Lieberman & Pavane

[57] ABSTRACT

The present invention discloses a delay circuit which obtains constant a delay time of delay circuit using an output capacitor by making the resistance of MOS transistor lowest, at the low voltage, middle at the intermediate voltage, and largest at the high voltage, so that the delay time of delay circuit using an output capacitor is kept constant regardless of the change in power source voltage.

7 Claims, 4 Drawing Sheets

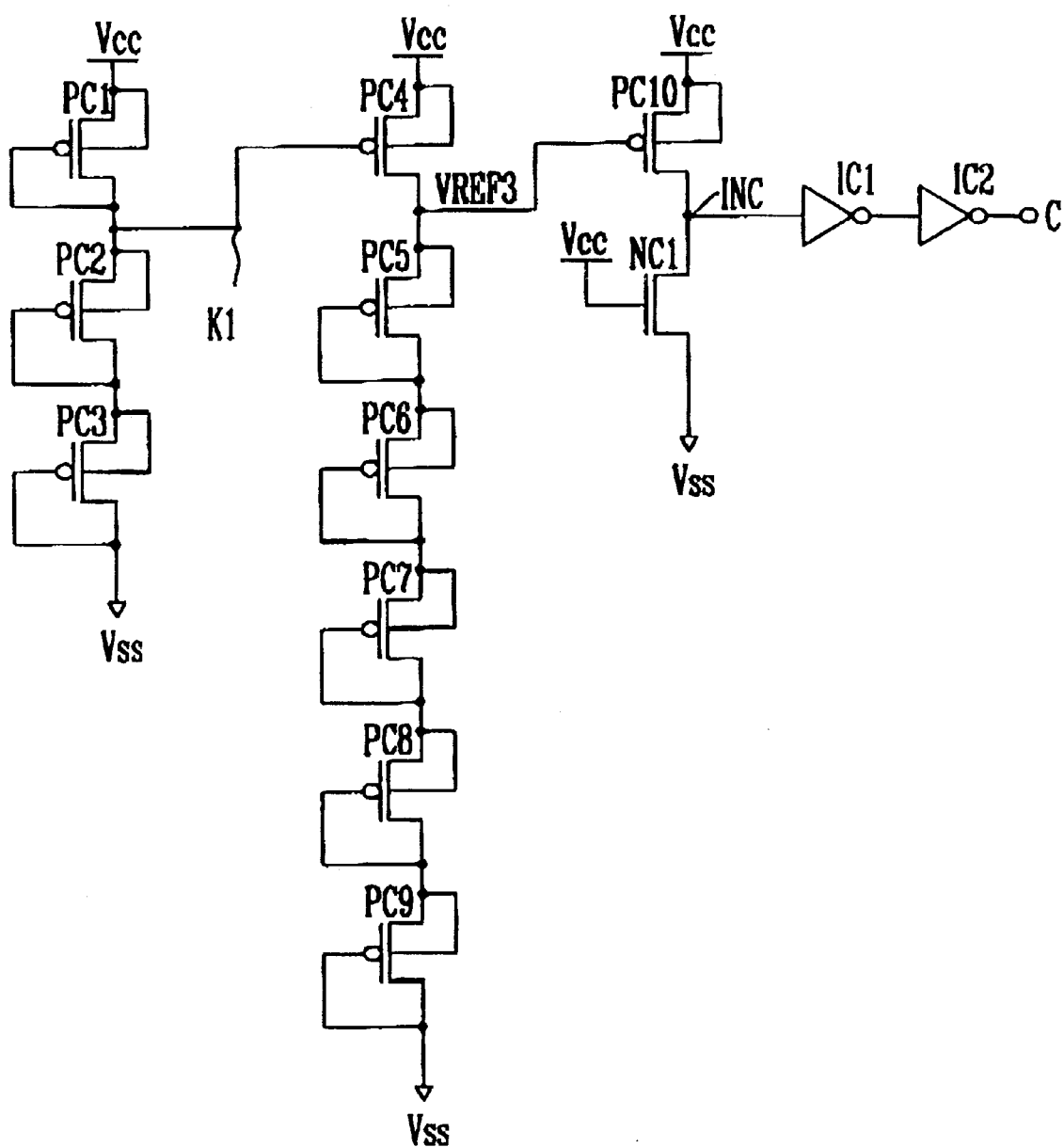
1C

DELAY CIRCUIT PROVIDING CONSTANT DELAY REGARDLESS OF VARIATIONS IN POWER SUPPLY

BACKGROUND OF INVENTION

1. Field of the Invention

The present invention relates to a delay circuit and, in particular, to a delay circuit which can maintain a constant delay time regardless of a change in power source voltage.

2. Information Disclosure Statement

In general, a current driving ability of a MOS transistor used in the delay circuit varies with the change in the power Source voltage. Therefore, a conventional delay circuit in which a capacitor is connected to an output has a great disadvantage in that the change in the delay is large according to the change in the power source voltage.

SUMMARY OF THE INVENTION

Therefore, an object of the invention is to provide a delay circuit which can solve the above described disadvantage by making a resistance of the MOS transistor small at low voltage($4 \leq Vcc < 5$), medium at medium voltage($5 \leq Vcc < 6$), and large at high voltage($Vcc \geq 6$).

A delay circuit according to the present invention to accomplish the above described object comprises:
- a pull-up transistor which is connected between a voltage source and an output terminal, and to a gate electrode of which an input signal is supplied:
- a voltage detection circuit;
- a plurality of transistors which are connected in parallel between the output terminal and a node, wherein the transistors have variable resistance according to output signals of the voltage detection circuit;
- a pull-down transistor which is connected between the node and a ground, and to a gate electrode of which the input signal is supplied; and
- a capacitor connected between the output terminal and the ground.

According to the present invention, the delay time of the delay circuit using the MOS transistor and the output capacitor can be kept constant regardless of the change in the power source voltage.

BRIEF DESCRIPTION OF THE DRAWINGS

For fuller understanding of the nature and object the invention, reference should be had to the following detailed description taken in conjunction with the accompanying drawings in which:

FIGS. 1A to 1C are detailed circuit diagram of a voltage detection circuit for driving a delay circuit according to the present invention;

Similar reference characters refer to similar parts in the several views of the drawings.

DETAILED DESCRIPTION OF THE INVENTION

The present invention will be described in detail with reference to the accompanying drawings.

Figure 1A:
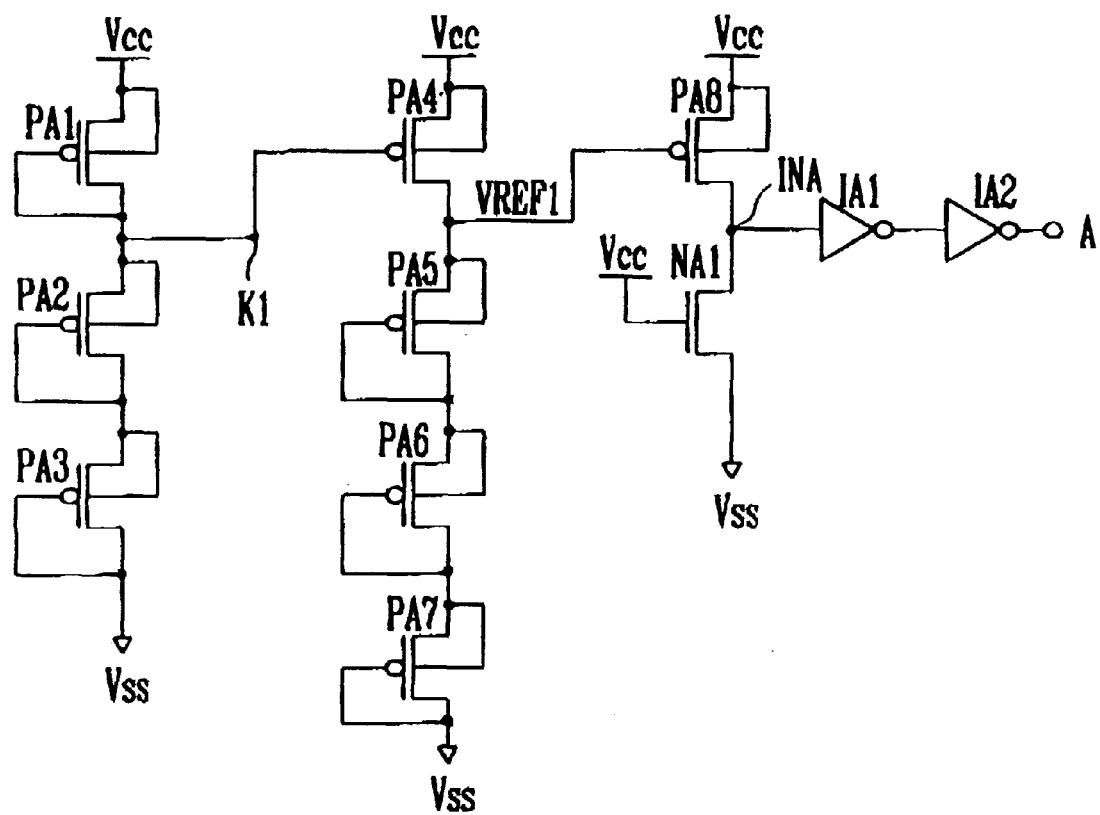
Figure 1B:
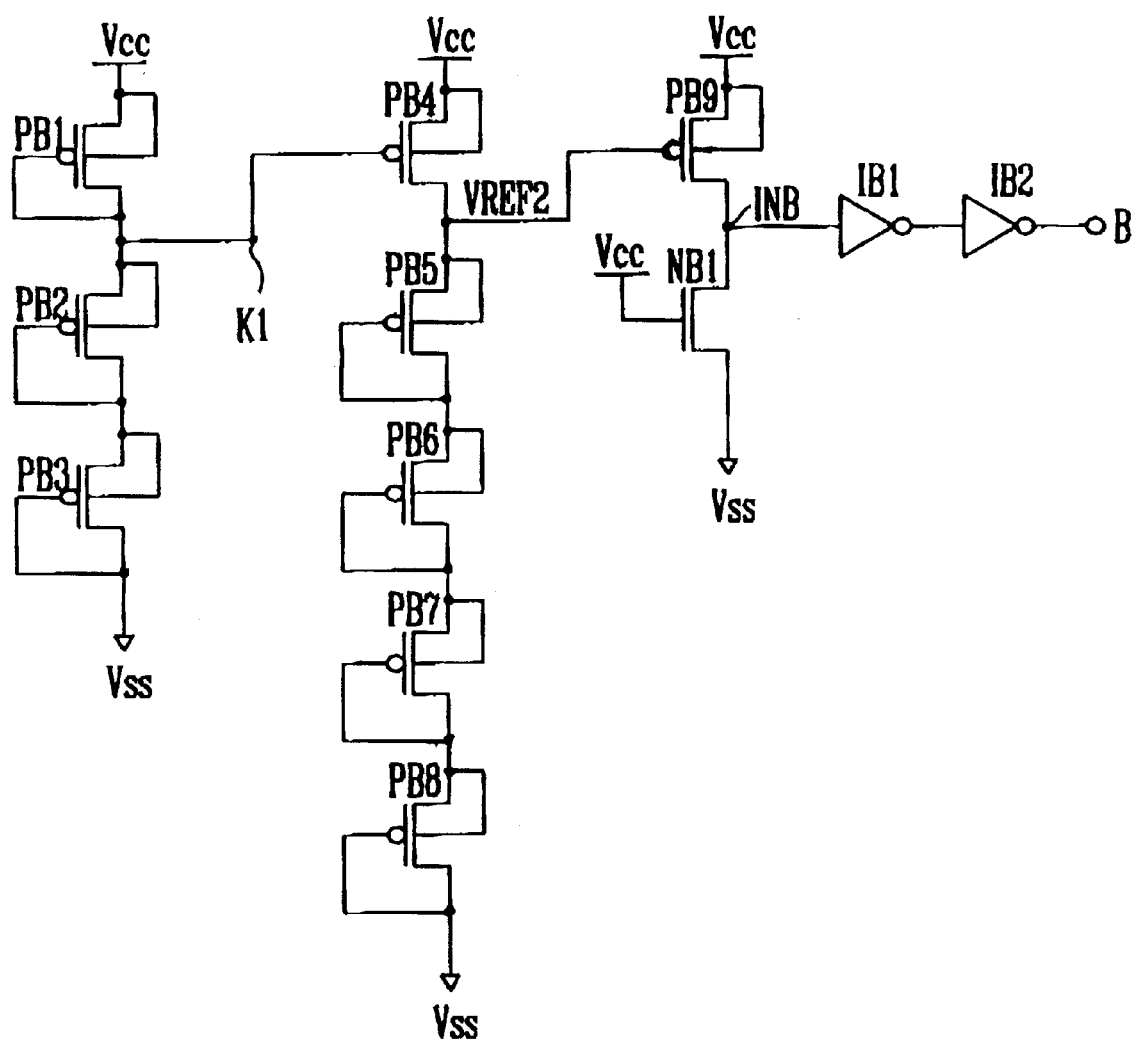

FIGS. 1A to 1C are detailed circuit diagrams of a voltage detection circuit for driving a delay circuit according to the present invention.

Figure 2:
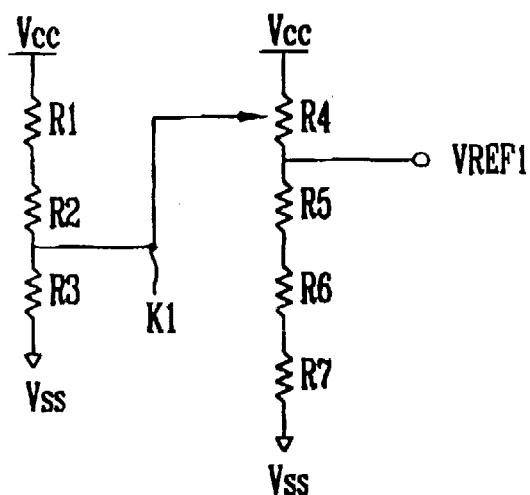
FIG. 2 shows an equivalent circuit diagram of FIG. 1A.

First, the operation of the voltage detection circuit shown in FIG. 1A will be described with reference to FIG. 2.

PMOS transistors PA1, PA2 and PA3 are connected between a power source Vcc and a ground terminal Vss. The PMOS transistors PA1, PA2 and PA3 can be considered as resistors R1, R2 and R3 shown in FIG. 2. Therefore, the output voltage K1 can be presented by following equation $$K1 = \frac{R3}{R1 + R2 + R3} \times Vcc \qquad (1)$$

If R3>>R1(=R2), then K1=Vcc. The output voltage K1 become same as the power source voltage.

The output voltage K1 has same inclination as that of the power source voltage Vcc supplied to the source of PMOS transisitor PA4. If PMOS transistors PA5, PA6 and PA7 have the same dimension (Width/length) and threshold voltage (Vt=0.9 V), they will turn on when the power source voltage Vcc is larger than or equal to, for example, 3.0 V. A first reference voltage VREF1 can be presented by following equation.

$$VREF1 = \frac{R5 + R6 + R7}{R4 + R5 + R6 + R7} \times Vcc \qquad (2)$$

$$VREF1 = \frac{1}{R_4} \times Vcc = 0.$$

That is, if Vcc is 3.0, the first reference voltage VREF1 becomes Vcc, while if Vcc>3.0 V, then the inclination of the first reference voltage VREF 1 becomes ("0". That is, if the power source voltage is larger than or equal to 3.0 V, the first reference voltage VREFl maintains to be 3.0 V.

When VREF 1 is larger than or equal to 3.0 V, that is, when the power source voltage is larger then or equal to 4.0 V, a transistor PA8 turns on so that a node INA maintains to be the power source voltage Vcc. Otherwise, the node INA maintains 0 volt.

The voltage of the node INA is supplied to an output terminal a through two inverters IA1 and IA2.

Next, the operation of FIG. 1B will be described.

PMCOS transistors PB1, PB2 and PB3 are connected between a power source Vcc and a ground terminal Vss. The PMOS transitors PB1, PB2 and PB3 can be considered as resistors R1, R2 and R3. Therefore, the output voltage K1 can be presented by following equation.

$$K1 = \frac{R3}{R1 + R2 + R3} \times Vcc \qquad (3)$$

If R3>>R1(=R2), then K1=Vcc. The output voltage K1 become same as the power source voltage.

The output K1 has same inclination as that of the power source voltage Vcc supplied to the source of PMOS transistor PB4. If PMOS transistors PB5, PB6, PB7 and PB8 have the same dimension (Width/length) and threshold voltage(Vt=0.9 V), they will turn on when the power source voltage Vcc is larger than or equal to, for example, 4.0 V. A second reference voltage VREF2 can be presented by following equation.

$$VREF1 = \frac{R5 + R6 + R7 + R8}{R4 + R5 + R6 + R7 + R8} \times Vcc \quad (4)$$

If R4>>R5(=R6=R7=R8), then $$VREF2 = \frac{1}{R_4} \times Vcc = 0.$$

That is, if Vcc is 4.0 V, the second refeencce voltage VREF2 becomes Vcc, while if Vcc>4.0 V, then the inclination of the second reference voltage VREF2 becomes "0". That is, if the power source voltage is larger than or equal to 4.0 V, the second reference voltage VREF2 maintains to be 4.0 V.

When VREF2 is larger than or equal to 4.0 V, that is, when the power source voltage is larger then or equal to 5.0 V, a transistor PB9 turns on so that a node INB maintains to be the power source voltage Vcc. Otherwise, the node INB maintains 0 volt.

The voltage of the node INB is supplied to the output terminal B through two inverters IB1 and IB2.

Next, the operation of FIG. 1C will be described.

PMOS transistors PC1, PC2 and PC3 are connected between a power source Vcc and a ground terminal Vss. The PMOS transistors PC1, PC2 and PC3 can be considered as resistors R1, R2 and R3. Therefore the output voltage K1 can be presented by following equation.

$$K1 = \frac{R3}{R1 + R2 + R3} \times Vcc \quad (5)$$

If R3>>R1 (=R2), then K1=Vcc. The output voltage K1 becomes same as the power source voltage.

The output K1 has same inclination as that of the power source, voltage Vcc supplied to the source of PMOS transistor PC4. If PMOS transistors PC5, PC6, PC7, PC8 and PC9 have, the same dimension (width/length) and threshold voltage(Vt=0.9 V), they will turn on when the power source voltage Vcc is larger than or equal to, for example, 5.0 V. A third reference voltage VREF3 can be presented by following equation.

$$VREF1 = \frac{R5 + R6 + R7 + R8 + R9}{R4 + R5 + R6 + R7 + R8 + R9} \times Vcc \quad (6)$$

If R4>>R5(=R6=R7=R8=R9) then $$VREF3 = \frac{1}{R_4} \times Vcc = 0.$$

That is, if Vcc is 5.0 V, the third reference voltage VREF3 becomes Vcc, while if Vcc>5.0 V, then the inclination of the first reference voltage VREF3 becomes "0". That is, if the power source voltage is larger than or equal to 5.0 V, the third reference voltage VREF3 maintains to be 5. 0 V.

When VREF3 is larger than or equal to 5.0 V. that is, when the power source voltage is larger then or equal to 5.0 V, transistor PC10 turns on so that a node INC maintains to be the power source voltage Vcc. Other wise, the node INC maintains 0 volt.

The voltage of the node INC is supplied to an output terminal C through two inverters IC1 and IC2.

Figure 3:
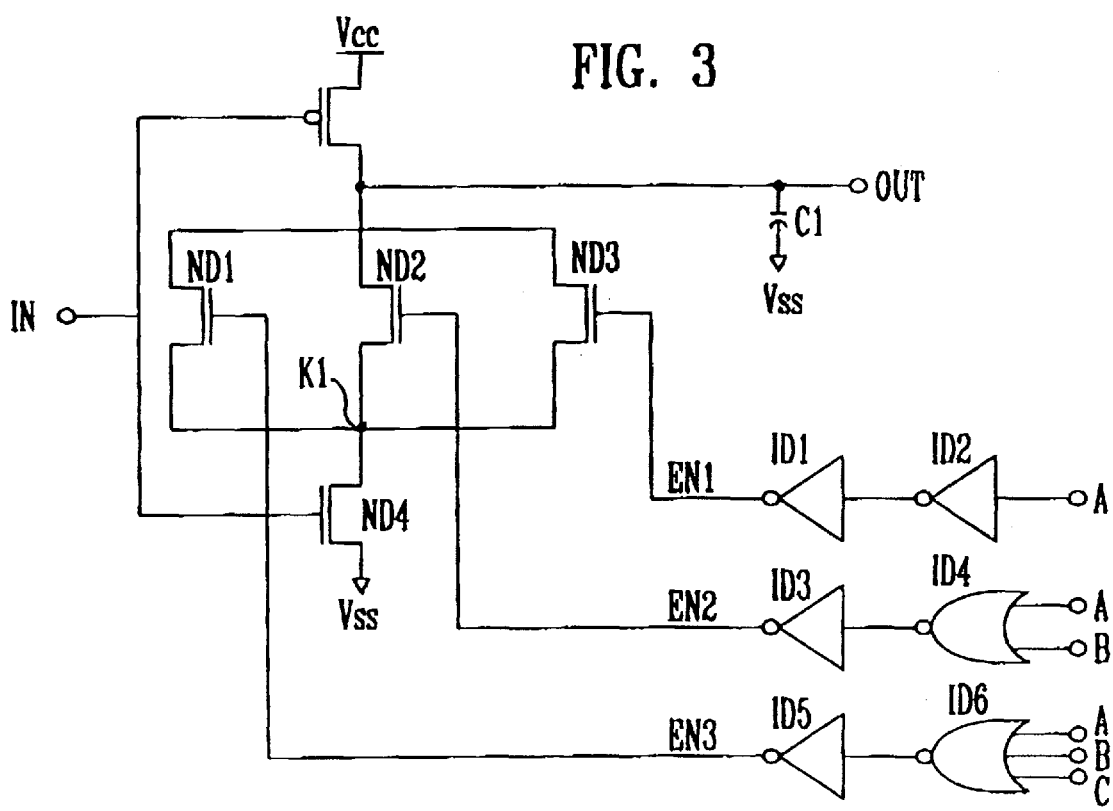
FIG. 3 shows the delay circuit according to the present invention.

FIG. 3 shows a circuit diagram according to the present invention.

A pull up transistor PU1 is connected between a power source Vcc and an output terminal OUT. NMOS transistors ND1, ND2, ND3 are connected in parallel between the output terminal OUT and a node K1. A NMOS transistor ND4 is connected between the node K1 and a ground Vss. An input signal IN is supplied to gate electrodes of the pull-up transistor PU1 and transistor ND4. A capacitor C1 is connected between the output terminal OUT and ground Vss. The signal of the output terminal A of FIG. 1 is input to the gate electrode of the transistor ND3 via two inverters ID1, ID2. The signal of the output terminals A,B of FIGS. 1 and 2, respectively, are input to a NOR gate ID4. An output signals of the NOR gate ID4 is input to the gate electrode of the transistor ND2 via an inverter ID3. The signals of the output terminals A, B, C of FIGS. 1, 2 and 3, respectively are input to a NOR gate ID6. The output signal of the NOR gate ID6 is input, to the gate electrode of a transistor ND1 via an inverter ID5.

If the power source voltage Vcc of the delay circuit is 4≦Vcc<5, all of the first through third enable signals EN1, EN2, and EN3 are in condition of the power source voltage Vcc. Therefore, since NMOS transistors ND1, ND2, ND3 are connected in parallel, they have low resistance value. If the power Source voltage Vcc is 5≦Vcc<6, then the first enable signal EN1, becomes O V, and the second and third enable signals EN2, EN3 become Vcc so that NMOS transistor ND3 is turned off while NMOS transistors ND1, ND2 are turned on so as to have intermediate parallel resistance value. If the power source voltage Vcc is 6≦Vcc<7, the first and second enable signal EN1, EN2 become O V, and the third enable signal EN3 becomes Vcc so as to have only the resistance value caused by NMOS transistor ND1.

As described above, the present invention has an excellent effect of adjusting the delay time of the delay circuit using the output capacitor by adjusting the resistance value, by adjusting the size of NMOS transistor driven according to the power source voltage.

What is claimed is:

1. A delay circuit comprising:
    a pull-up transistor which is connected between a voltage source and an output terminal, and to a gate electrode of which an input signal is supplied;
    a plurality of transistors which are connected in parallel between said output terminal and a node, wherein a total resistance of said transistors is varied by output signals of a voltage detection circuit;
    wherein said voltage detection circuit comprises first, second, and third detection circuits,
    said first voltage detection circuit coupled to a first selected transistor of said plurality of transistors so that said first voltage detection circuit outputs the source voltage of said voltage source or zero volts in response to a first reference voltage and a first variation of said voltage source;
    said second voltage detection circuit coupled to a second selected transistor of said plurality of transistors so that said second voltage detection circuit outputs the source voltage or zero volts in response to a second reference voltage and a second variation of said voltage source; and
    said third voltage detection circuit coupled to a third selected transistor of said plurality of transistors so that said third voltage detection circuit outputs the source voltage or zero volts in response to a third reference voltage and a third variation of said voltage source;

a pull-down transistor which is connected between said node and a ground, and to a gate electrode of which said input signal is supplied; and a capacitor connected between said output terminal and said ground.

2. The delay circuit claim 1, wherein said first, second and third selected transistors are NMOS transistors.

3. The delay circuit claim 1, wherein an on/off state of said first selected transistor is responsive to an output of said first voltage detection circuit.

4. The delay circuit claim 1, wherein an on/off state of said second selected transistor is responsive to a signal obtained by combining outputs of said first and second voltage detection circuits.

5. The delay circuit claim 1, wherein an on/off state of said third selected transistor is responsive to a signal obtained by combining outputs of said first, second and third voltage detection circuits.

6. A delay circuit comprising:

a pull-up transistor connected between an output terminal and a voltage source having an output source voltage, and having a gate electrode for receiving an input signal;

three voltage detection circuits to detect three different reference voltages to control a variable resistance;

a plurality of transistors connected in parallel between said output terminal and a node, wherein the resistance of each of said plural transistors is the same and each of said plural transistors is selectively turned on according to output signals of said voltage detection circuits;

a pull-down transistor connected between said node and a ground, and having a gate electrode for receiving said input signal; and a capacitor connected between said output terminal and said ground.

7. The delay circuit of claim 6, wherein said voltage detection circuits comprise:

a first voltage detection circuit coupled to a first selected transistor of said plurality of transistors so that said first voltage detection circuit outputs the output source voltage of said voltage source or zero volts in response to a first reference voltage of said three different reference voltages and a first variation of said voltage source;

a second voltage detection circuit coupled to a second selected transistor of said plurality of transistors so that said second voltage detection circuit outputs the output source voltage of said voltage source or zero volts in response to a second reference voltage of said three different reference voltages and a second variation of said voltage source; and a third voltage detection circuit coupled to a third selected transistor of said plurality of transistors so that said third voltage detection circuit outputs the output source voltage of said voltage source or zero volts according to a third reference voltage of said three different reference voltages and a third variation of said voltage source.

* * * * *